US009071252B2

(12) United States Patent
Sato et al.

(10) Patent No.: US 9,071,252 B2
(45) Date of Patent: Jun. 30, 2015

(54) RADIO COMMUNICATION APPARATUS

(75) Inventors: Kazumi Sato, Kanagawa (JP); Yosuke Ogasawara, Kanagawa (JP)

(73) Assignee: Kabushiki Kaisha Toshiba, Minato-ku, Tokyo (JP)

( * ) Notice: Subject to any disclaimer, the term of this patent is extended or adjusted under 35 U.S.C. 154(b) by 760 days.

(21) Appl. No.: 13/234,596

(22) Filed: Sep. 16, 2011

(65) Prior Publication Data

US 2012/0134447 A1    May 31, 2012

(30) Foreign Application Priority Data

Nov. 29, 2010    (JP) ................................. 2010-264889

(51) Int. Cl.
 H03L 7/089    (2006.01)
 H04L 7/033    (2006.01)
 H03L 7/093    (2006.01)

(52) U.S. Cl.
 CPC .............. *H03L 7/0891* (2013.01); *H04L 7/033* (2013.01); *H03L 7/093* (2013.01)

(58) Field of Classification Search
 CPC ......... H03L 7/08; H03L 7/0891; H03L 7/093; H03L 7/095; H04L 7/00; H04L 7/0079; H04L 7/033; H04L 7/06; H04L 27/2272; H04L 27/2273
 USPC ......... 375/259, 260, 316, 324, 326, 327, 340, 375/344, 345, 354, 362; 329/304, 306, 307, 329/315, 325, 345, 347, 360; 348/725, 726, 348/735; 455/73, 84, 88
 See application file for complete search history.

(56) References Cited

U.S. PATENT DOCUMENTS

| 5,392,460 | A  | * | 2/1995  | Mattila et al. .................... 455/76 |
|-----------|----|---|---------|-------------------------------------------|
| 6,618,458 | B1 | * | 9/2003  | Nishimura .................... 375/364 |
| 6,744,828 | B1 |   | 6/2004  | Uchiyama et al. |
| 7,130,603 | B2 |   | 10/2006 | Futamura et al. |
| 7,633,347 | B2 |   | 12/2009 | Tan et al. |
| 7,825,707 | B2 |   | 11/2010 | Ebuchi |
| 2003/0026368 | A1 | * | 2/2003 | Subramoniam et al. ...... 375/354 |
| 2003/0137912 | A1 | * | 7/2003 | Ogura ........................ 369/47.39 |
| 2008/0218277 | A1 |   | 9/2008  | Tan et al. |

(Continued)

FOREIGN PATENT DOCUMENTS

| CN | 101262224 A | 9/2008 |
| JP | 10-093432 | 4/1998 |
| JP | 11-143572 | 5/1999 |

(Continued)

OTHER PUBLICATIONS

Combined Office Action and Search Report issued on Nov. 15, 2013 in Chinese Patent Application No. 201110277364.0, along with English translation.

(Continued)

*Primary Examiner* — Young T Tse
(74) *Attorney, Agent, or Firm* — White & Case LLP

(57) ABSTRACT

According to one embodiment, an analog unit performs frequency conversion of a reception signal. A digital unit performs demodulation processing of the reception signal subjected to the frequency conversion by the analog unit. A PLL circuit generates a clock of the digital unit. A PLL-setting changing unit performs, based on the reception signal, a setting change of parameters of the PLL circuit to thereby control the jitter of the clock.

14 Claims, 3 Drawing Sheets

(56) References Cited

U.S. PATENT DOCUMENTS

2009/0284297 A1 11/2009 Ebuchi
2012/0082151 A1* 4/2012 Liu et al. .................. 370/342

FOREIGN PATENT DOCUMENTS

| JP | 2008-311838 A | 12/2008 |
|---|---|---|
| JP | 2010-045443 | 2/2010 |
| JP | 2010-192976 A | 9/2010 |
| WO | 03032508 A1 | 4/2003 |
| WO | 2007/080719 A1 | 7/2007 |
| WO | 2007082282 A1 | 7/2007 |

OTHER PUBLICATIONS

Japanese Office Action mailed on Oct. 22, 2013 in corresponding JP Application No. 2010-264889, along with English translation.
Chinese Office Action issued in corresponding CN Application No. 2011102773640 on Apr. 30, 2014, along with English translation.

* cited by examiner

US 9,071,252 B2

RADIO COMMUNICATION APPARATUS

CROSS-REFERENCE TO RELATED APPLICATIONS

This application is based upon and claims the benefit of priority from the prior Japanese Patent Application No. 2010-264889, filed on Nov. 29, 2010; the entire contents of which are incorporated herein by reference.

FIELD

Embodiments described herein relate generally to a radio communication apparatus.

BACKGROUND

In radio systems such as M-WiMAX, WLAN, and LTE, radio terminals are requested to have high reception sensitivity to secure wide communication areas. On the other hand, the radio terminals are requested to be reduced in size. There is an increasing demand for a one-chip LSI mixedly mounted with an analog unit and a digital unit of a radio communication system. In the one-chip LSI, it is likely that spurious due to an N-times harmonic of a clock generated by the digital unit leaks into the analog unit and deteriorates a reception characteristic. Therefore, measures for preventing the spurious from getting on the analog unit could be applied.

DETAILED DESCRIPTION

In general, according to one embodiment, a radio communication apparatus includes an analog unit, a digital unit, a PLL circuit, and a PLL-setting changing unit. The analog unit performs frequency conversion of a reception signal. The digital unit performs demodulation processing of the reception signal subjected to the frequency conversion by the analog unit. The PLL circuit generates a clock of the digital unit. The PLL-setting changing unit performs, based on the reception signal, a setting change of parameters of the PLL circuit to thereby control the jitter of the clock.

Exemplary embodiments of a radio communication apparatus will be explained below in detail with reference to the accompanying drawings. The present invention is not limited to the following embodiments.

Figure 1:
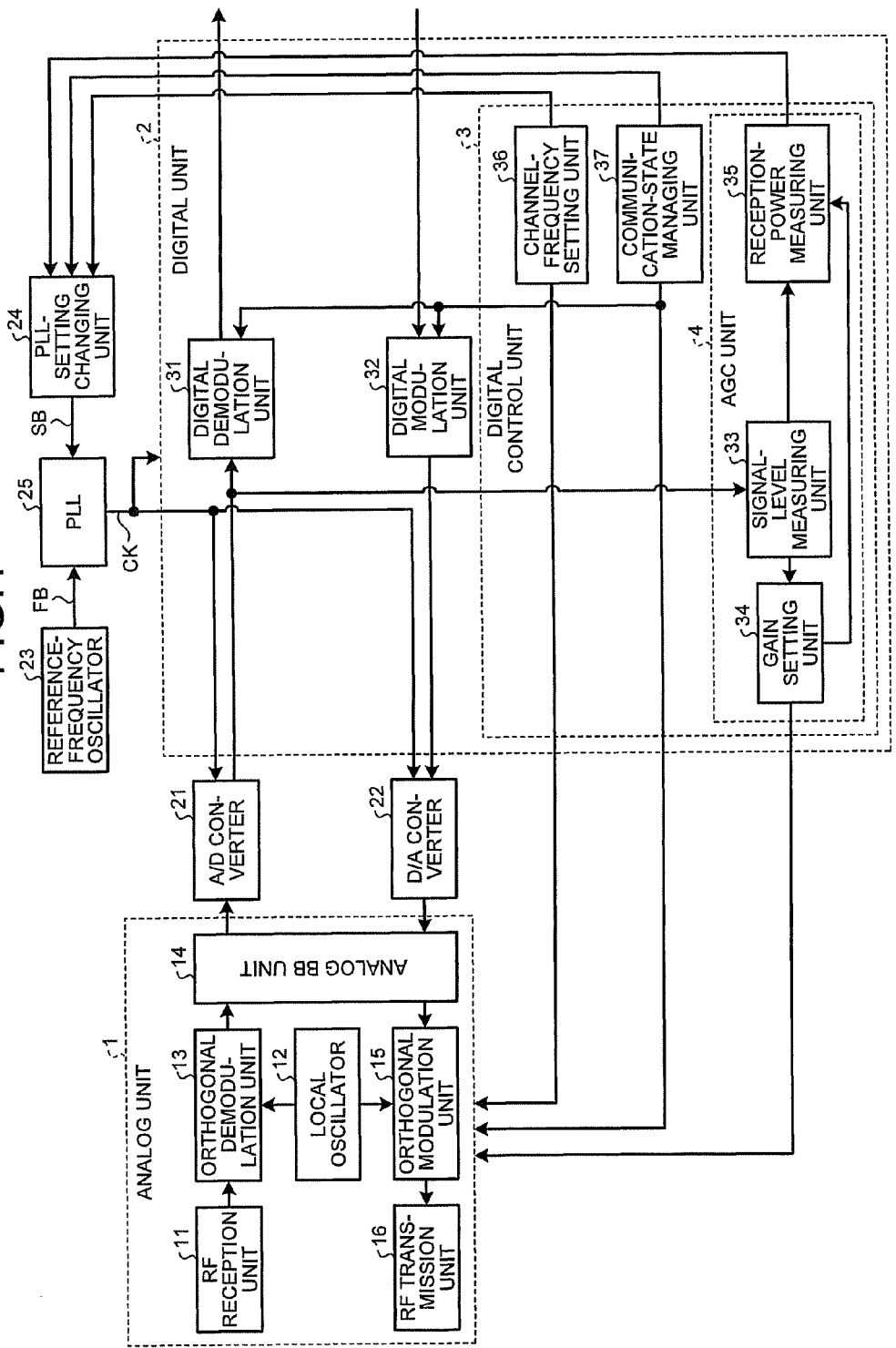
FIG. 1 is a block diagram of a schematic configuration of a radio communication apparatus according to an embodiment.

FIG. 1 is a block diagram of a schematic configuration of a radio communication apparatus according to an embodiment.

In FIG. 1, the radio communication apparatus includes an analog unit 1 that performs frequency conversion of a reception signal and a transmission signal, a digital unit 2 that performs digital demodulation processing of the reception signal and digital modulation processing of the transmission signal, an A/D conversion unit 21 that converts an analog signal output from the analog unit 1 into a digital signal, and a D/A conversion unit 22 that converts a digital signal output from the digital unit 2 into an analog signal. The analog unit 1, the digital unit 2, the A/D conversion unit 21, and the D/A conversion unit 22 can be mixedly mounted on one chip.

The radio communication apparatus also includes a PLL circuit 25 that generates a clock CK of the digital unit, a PLL-setting changing unit 24 that performs a setting change of parameters of the PLL circuit 25 to thereby control the jitter of the clock CK, and a reference frequency oscillator 23 that generates a reference signal FB serving as a reference frequency of the PLL circuit 25. The jitter of the clock CK refers to temporal fluctuation of the frequency of the clock CK.

The analog unit 1 includes an RF reception unit 11 that receives a reception signal in a radio frequency band, a local oscillator 12 that generates a local oscillation signal, an orthogonal demodulation unit 13 that down-converts the reception signal in the radio frequency band to a baseband, an analog BB unit 14 that subjects the reception signal or a transmission signal to analog processing in the base band, an orthogonal modulation unit 15 that up-converts the transmission signal in the baseband to a radio frequency band, and an RF transmission unit 16 that transmits the transmission signal in the radio frequency band.

The digital unit 2 includes a digital demodulation unit 31 that performs digital demodulation processing of a reception signal, a digital modulation unit 32 that performs digital modulation processing of a transmission signal, and a digital control unit 3 that performs control of the digital unit 2.

The digital control unit 3 includes an ACG unit 4 that controls the gain of the analog unit 1 based on a signal level of a reception signal, a channel-frequency setting unit 36 that sets a channel frequency at which the reception signal can be received, and a communication-state managing unit 37 that manages whether the present communication state is a reception state or a transmission state. The signal level indicates an amplitude level of the reception signal after A/D conversion.

The ACG unit 4 includes a signal-level measuring unit 33 that measures a signal level of a reception signal, a gain setting unit 34 that sets the gain of the analog unit 1 based on the signal level of the reception signal, and a reception-power measuring unit 35 that measures reception power based on the signal level of the reception signal.

The reception signal received by the RF reception unit 11 is output to the orthogonal demodulation unit 13. In the orthogonal demodulation unit 13, the reception signal is mixed with the local oscillation signal generated by the local oscillator 12 to thereby be frequency-converted from the radio frequency band to the baseband and output to the analog BB unit 14. After being subjected to the analog processing by the analog BB unit 14, the reception signal is converted into a digital signal by the A/D conversion unit 21 and subjected to the digital demodulation processing by the digital demodulation unit 31.

On the other hand, the transmission signal subjected to the digital modulation by the digital modulation unit 32 is converted into an analog signal by the D/A conversion unit 22 and then subjected to the analog processing by the analog BB unit 14 and output to the orthogonal modulation unit 15. In the orthogonal modulation unit 15, the transmission signal is mixed with the local oscillation signal generated by the local oscillator 12 to thereby be frequency-converted from the baseband to the radio frequency band and transmitted via the RF transmission unit 16.

The reference signal FB is output from the reference frequency oscillator 23 to the PLL circuit 25. In the PLL circuit 25, the clock CK frequency-controlled to be phase-locked to the reference signal FB is generated and output to the A/D conversion unit 21, the D/A conversion unit 22, and the digital unit 2.

In the signal-level measuring unit 33, a signal level of the reception signal is measured based on the reception signal converted into the digital signal by the A/D conversion unit 21 and output to the gain setting unit 34 and the reception-power measuring unit 35. In the gain setting unit 34, the gain of the analog unit 1 is set based on the signal level of the reception signal.

In the reception-power measuring unit 35, reception power is measured based on the signal level of the reception signal and output to the PLL-setting changing unit 24. The reception power can be calculated by an addition of an amplitude level of the reception signal after the A/D conversion and a gain setting value. Channel frequency setting information is output from the channel-frequency setting unit 36 to the analog unit 1 and the PLL-setting changing unit 24. Communication state information is output from the communication-state managing unit 37 to the analog unit 1, the PLL-setting changing unit 24, the digital demodulation unit 31, and the digital modulation unit 32.

In the analog unit 1, the frequency of the local oscillation signal is controlled based on the channel frequency setting information and a reception channel and a transmission channel are selected. In the analog unit 1, switching of transmission and reception is performed based on the communication state information.

In the PLL-setting changing unit 24, a setting control signal SB for performing the setting change of the parameters of the PLL circuit 25 is generated based on the reception power, the channel frequency setting information, and the communication state information. In the PLL circuit 25, the setting change of the parameters of the PLL circuit 25 is performed based on the setting control signal SB, whereby the jitter of the clock CK is controlled.

Consequently, when the signal level is high and the influence of spurious on the reception signal is small, it is possible to reduce the jitter of the clock CK and satisfactorily maintain modulation accuracy. On the other hand; when the signal level is low and the influence of spurious on the reception signal is large, it is possible to reduce the spurious by increasing the jitter of the clock CK. It is possible to suppress deterioration in a reception characteristic due to the spurious while suppressing deterioration in modulation accuracy.

Examples of the parameters of the PLL circuit 25 subjected to the setting change when the jitter of the clock CK is controlled include a current setting value of a charge pump circuit or a bandwidth setting value of a loop filter of the PLL circuit 25.

Figure 2:
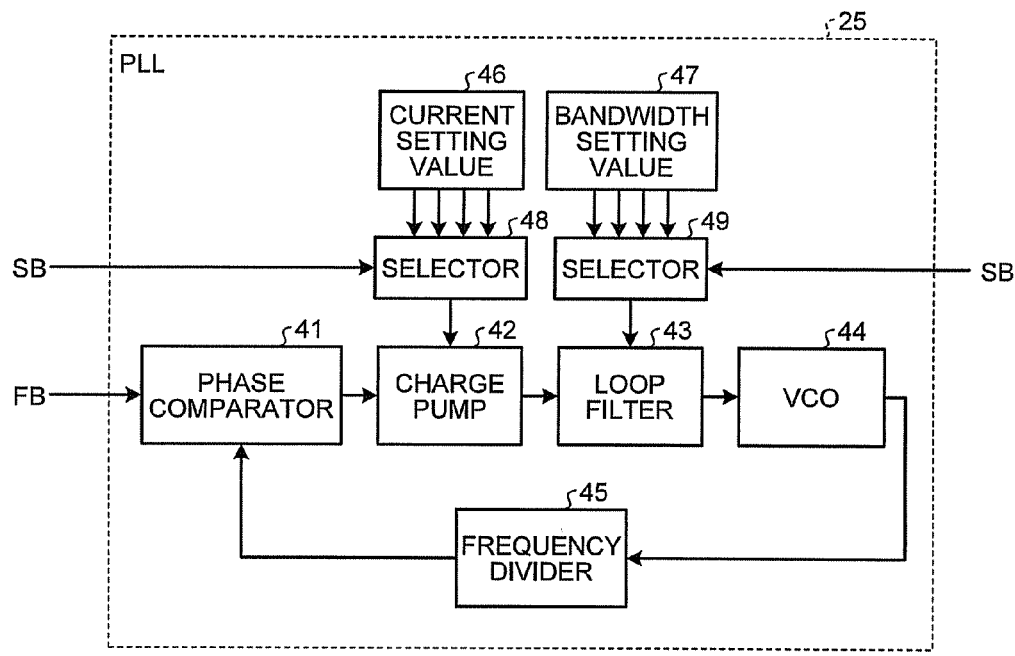
FIG. 2 is a block diagram of a schematic configuration of a PLL circuit shown in FIG. 1.

FIG. 2 is a block diagram of a schematic configuration of the PLL circuit shown in FIG. 1.

In FIG. 2, the PLL circuit 25 includes a voltage control oscillator 44 that controls an oscillation frequency of the clock CK, a frequency divider 45 that subjects the frequency of the clock CK to frequency division, a phase comparator 41 that compares the phase of the clock CK and the phase of the reference signal FB, a charge pump circuit 42 that generates a voltage corresponding to a phase error between the clock CK and the reference signal FB, and a loop filter 43 that reduces a high-frequency component included in the voltage generated by the charge pump circuit 42.

The PLL circuit 25 includes a selector 48 that switches a current setting value 46 of the charge pump circuit 42, a bandwidth setting value 47 and the current setting value 46 of the loop filter 43 and a selector 49 that switches the bandwidth setting value 47.

The clock CK generated by the voltage control oscillator 44 is subjected to frequency division by the frequency divider 45 and then input to the phase comparator 41. In the phase comparator 41, the phase of the clock CK subjected to frequency division by the frequency divider 45 is compared with the phase of the reference signal FB. A phase error between the phases is output to the charge pump circuit 42. In the charge pump circuit 42, a voltage corresponding to the phase error between the phases is generated. After a ripple is reduced by the loop filter 43, the voltage is output to the voltage-control oscillator 44. In the voltage control oscillator 44, the frequency of the clock CK is controlled such that the phase is locked to the reference signal FB.

The setting control signal SB is output to the selector 48 from the PLL-setting change unit 24 shown in FIG. 1. In the selector 48, the current setting value 46 of the charge pump circuit 42 is switched based on the setting control signal SB and the gain of the charge pump circuit 42 is changed. When the gain of the charge pump circuit 42 is changed, sensitivity to the phase error is increased or reduced. The jitter of the clock CK can be increased or reduced.

The setting control signal SB is output to the selector 49 from the PLL-setting changing unit 24 shown in FIG. 1. In the selector 49, the bandwidth setting value 47 of the loop filter 43 is switched based on the setting control signal SB and the bandwidth of the loop filter 43 is increased or reduced. When the bandwidth of the loop filter 43 is increased or reduced, a follow-up ability of the oscillation frequency of the voltage-control oscillator 44 to the phase error is increased or reduced. The jitter of the clock CK can be increased or reduced.

When the present communication state is the reception state, the setting control signal SB can switch the current setting value 46 or the bandwidth setting value 47 such that the jitter of the clock CK increases. When the present communication state is the transmission state, the setting control signal SB can switch the current setting value 46 or the bandwidth setting value 47 such that the jitter of the clock CK decreases.

Alternatively, when spurious is present in the present channel frequency, the setting control signal SB can switch the current setting value 46 or the bandwidth setting value 47 such that the jitter of the clock CK increases. When spurious is absent in the present channel frequency, the setting control signal SB can switch the current setting value 46 or the bandwidth setting value 47 such that the jitter of the clock CK decreases.

Alternatively, when the reception power is smaller than a threshold, the setting control signal SB can switch the current setting value 46 or the bandwidth setting value 47 such that the jitter of the clock CK increases. When the reception power is equal to or larger than the threshold, the setting control signal SB can switch the current setting value 46 or the bandwidth setting value 47 such that the jitter of the clock CK decreases.

Figure 3A:
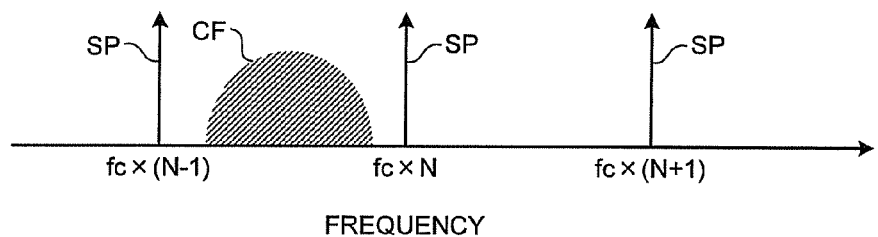
FIG. 3A is a diagram of spurious not overlapping a reception channel.
Figure 3B:
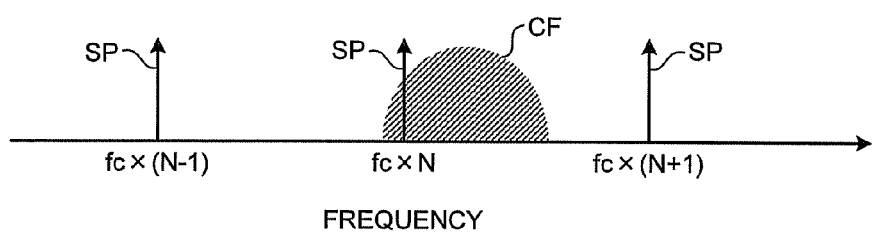
FIG. 3B is a diagram of spurious overlapping the reception signal.

FIG. 3A is a diagram of spurious not overlapping a reception channel. FIG. 3B is a diagram of spurious overlapping the reception signal.

In FIG. 3A, when the frequency of the clock CK is represented as fc, the frequency of the spurious SP is fc×N (N is an integer equal to or larger than 2). When a frequency band of the present reception channel CF does not overlap the frequency of the spurious SP, the current setting value 46 or the bandwidth setting value 47 can be switched such that the jitter of the clock CK decreases.

In this case, although the level of the spurious SP increases, the frequency band of the present reception channel CF does not overlap the frequency of the spurious SP. Therefore, the influence of the spurious SP on a reception signal can be suppressed.

On the other hand, in FIG. 3B, when the frequency band of the present reception channel CF overlaps the frequency of the spurious SP, the current setting value 46 or the bandwidth setting value 47 can be switched such that the jitter of the clock CK increases.

In this case, because the level of the spurious SP decreases, even when the frequency band of the present reception channel CF overlaps the frequency of the spurious SP, the influence of the spurious SP on a reception signal can be suppressed.

Figure 4:
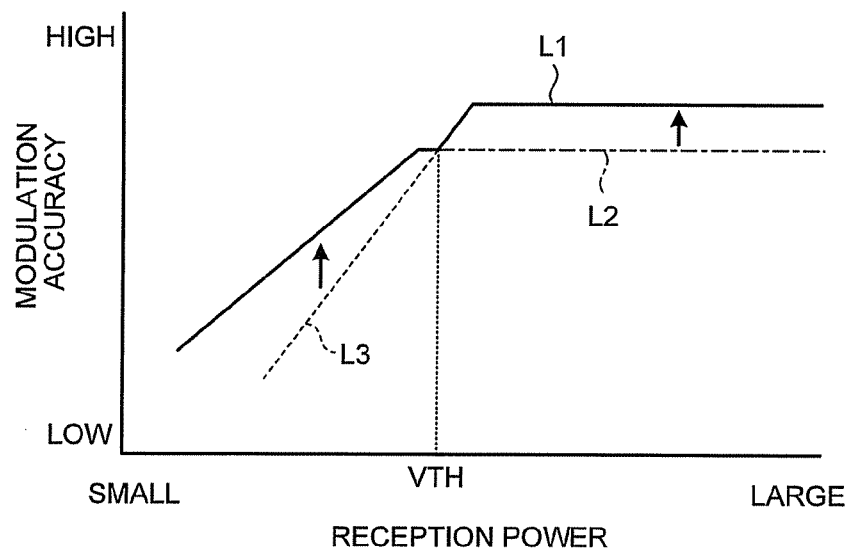
FIG. 4 is a diagram of a relation between reception power and modulation accuracy of the radio communication apparatus shown in FIG. 1.

FIG. 4 is a diagram of a relation between reception power and modulation accuracy of the radio communication apparatus shown in FIG. 1.

In FIG. 4, when the frequency band of the present reception channel CF overlaps the frequency of the spurious SP, the modulation accuracy is considerably deteriorated when the reception power decreases (L3).

On the other hand, when the jitter of the clock CK is increased irrespective of the magnitude of the reception power to reduce the level of the spurious SP, the modulation accuracy at small reception power can be improved. However, the modulation accuracy at large receptor power is deteriorated (L2).

On the other hand, it is possible to suppress, while improving the modulation accuracy at the small reception power, the deterioration in the modulation accuracy at the large reception power by increasing the jitter of the clock CK when the reception power is lower than a threshold VTH and reducing the jitter of the clock CK when the reception power is equal to or higher than the threshold VTH (L1).

Figure 5:
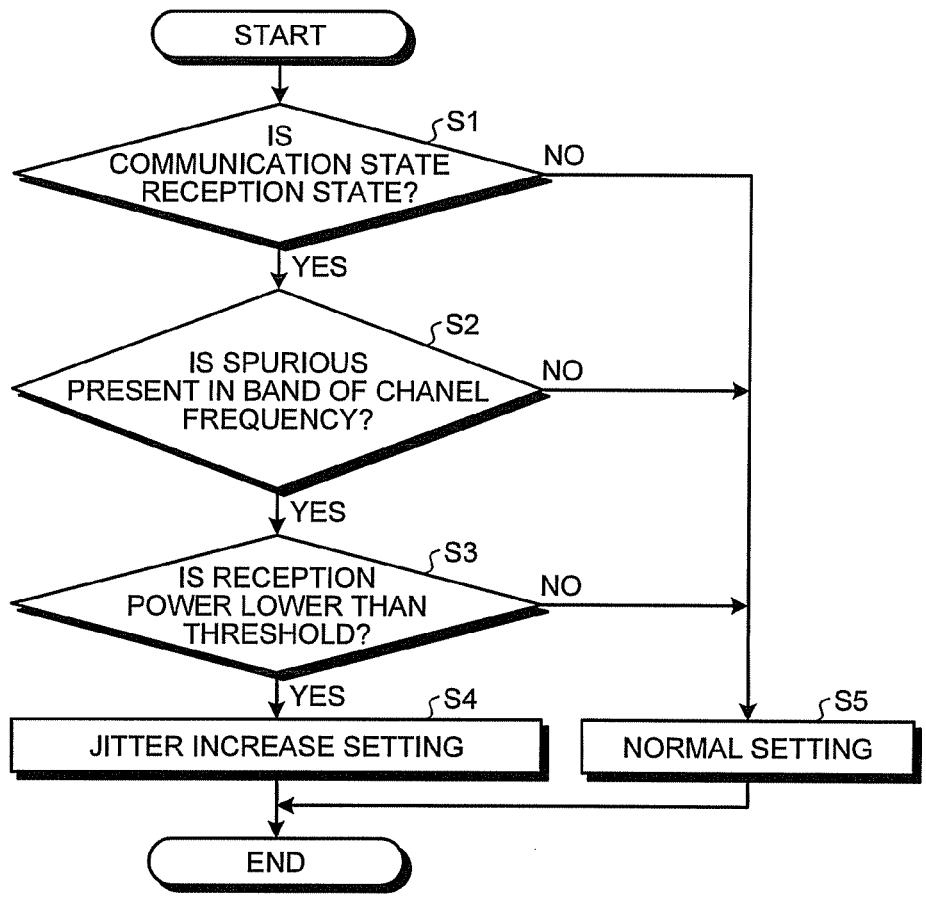
FIG. 5 is a flowchart for explaining an example of a PLL setting changing method for the radio communication apparatus shown in FIG. 1.

FIG. 5 is a flowchart for explaining an example of a PLL setting changing method for the radio communication apparatus shown in FIG. 1.

In FIG. 5, when the present communication state is the reception state (step S1), spurious is present in a channel frequency (step S2), and reception power is smaller than a threshold (step S3), the PLL-setting changing unit 24 shown in FIG. 1 increases the jitter of the clock CK (step S4).

On the other hand, when the present communication state is the transmission state (step S1), spurious is absent in the channel frequency (step S2), or reception power is equal to or higher than the threshold (step S3), the PLL-setting changing unit 24 normally sets the jitter of the clock CK (step S5).

In the example shown in FIG. 5, the method of controlling the jitter of the clock CK based on the three conditions of the communication state, the channel frequency, and the reception power is explained. However, it is unnecessary to use all of these conditions. The jitter of the clock CK can be controlled based on any one of the conditions.

When parameter setting for the PLL circuit 25 affects a characteristic other than a reception characteristic, a condition that affects this characteristic can be added to perform the parameter setting for the PLL circuit 25.

In the embodiment, the method of using the three conditions of the communication state, the channel frequency, and the reception power to control the jitter of the clock CK is explained. However, a condition other than these conditions can be used.

For example, the jitter of the clock CK can be controlled based on a modulation system such as BPSK, QPSK, 16QAM, or 64QAM. Specifically, in modulation systems with low modulation degrees such as BPSK and QPSK, because a reception signal level is considered to be low, the jitter of the clock CK can be increased. In modulation systems with high modulation degrees such as 16QAM and 64QAM, BPSK and QPSK, and the like, because a reception signal level is considered to be high, the jitter of the clock CK can be reduced.

In the embodiment, the method of controlling the jitter of the clock CK based on reception power is explained. However, a modulation index or an encoding ratio can be used instead of the reception power.

In the embodiment, the method of controlling the jitter of the clock CK based on reception power is explained. However, the jitter of the clock CK can be controlled based on any one of a reception level, a gain setting value, and reception power.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A radio communication apparatus comprising:
an analog unit configured to perform frequency conversion of a reception signal;
a digital unit configured to perform demodulation processing of the reception signal subjected to the frequency conversion by the analog unit;
a PLL circuit configured to generate a clock to the digital unit; and
a PLL-setting changing unit configured to perform, based on the reception signal, a setting change of parameters of the PLL circuit to thereby control a jitter of the clock, wherein the analog unit includes:
an RF reception unit configured to receive the reception signal in a radio frequency band;
a demodulation unit configured to down-convert the received reception signal in the radio frequency band to a baseband;
an analog baseband (BB) unit configured to subject the down-converted reception signal or a transmission signal to analog processing in the baseband;
a modulation unit configured to up-convert the transmission signal in the baseband to the radio frequency band; and
an RF transmission unit configured to transmit the transmission signal in the radio frequency band, wherein the digital unit includes an automatic gain control (AGC) unit configured to control a gain of the analog unit based on a signal level of the reception signal, and wherein the AGC unit includes:
a signal-level measuring unit configured to measure the signal level of the reception signal; and
a reception-power measuring unit configured to measure reception power based on the signal level of the reception signal, and
the PLL-setting changing unit performs the setting change of the parameters of the PLL circuit based on the reception power, wherein the PLL circuit includes:
a voltage control oscillator configured to control an oscillation frequency of the clock based on voltage control;

a frequency divider configured to subject the clock generated by the voltage control oscillator to frequency division;

a phase comparator configured to compare a phase of the clock subjected to the frequency division by the frequency divider and a phase of a reference signal;

a charge pump circuit configured to generate a voltage corresponding to a phase error between the clock and the reference signal;

a loop filter configured to reduce a high-frequency component included in the voltage generated by the charge pump circuit to generate the voltage control;

a first selector configured to switch a current setting value of the charge pump circuit based on a setting control signal from the PLL-setting changing unit; and a second selector configured to switch a bandwidth setting value of the loop filter based on the setting control signal from the PLL-setting changing unit.

2. The radio communication apparatus according to claim 1, further comprising:

an A/D conversion unit coupled to the analog BB unit that A/D-converts the reception signal in the baseband according to the clock generated by the PLL circuit and outputs the reception signal to the digital unit; and a D/A conversion unit coupled to the analog BB unit that D/A-converts the transmission signal in the baseband according to the clock generated by the PLL circuit and outputs the transmission signal to the analog BB unit.

3. The radio communication apparatus according to claim 2, wherein the digital unit further includes:

a digital demodulation unit configured to perform digital demodulation processing of the A/D-converted reception signal; and a digital modulation unit configured to perform digital modulation processing of the transmission signal.

4. The radio communication apparatus according to claim 1, wherein, when the reception power is smaller than a threshold, the PLL-setting changing unit increases the jitter of the clock compared with the jitter of the clock controlled when the reception power is equal to or larger than the threshold.

5. The radio communication apparatus according to claim 1, wherein, when the reception power is smaller than a threshold, the PLL-setting changing unit switches the current setting value or the bandwidth setting value to increase the jitter of the clock compared with the jitter of the clock controlled when the reception power is equal to or larger than the threshold.

6. A radio communication apparatus comprising:

an analog unit configured to perform frequency conversion of a reception signal;

a digital unit configured to perform demodulation processing of the reception signal subjected to the frequency conversion by the analog unit;

a PLL circuit configured to generate a clock to the digital unit; and a PLL-setting changing unit configured to perform, based on the reception signal, a setting change of parameters of the PLL circuit to thereby control a jitter of the clock, wherein the analog unit includes:

an RF reception unit configured to receive the reception signal in a radio frequency band;

a demodulation unit configured to down-convert the received reception signal in the radio frequency band to a baseband;

an analog baseband (BB) unit configured to subject the down-converted reception signal or a transmission signal to analog processing in the baseband;

a modulation unit configured to up-convert the transmission signal in the baseband to the radio frequency band; and an RF transmission unit configured to transmit the transmission signal in the radio frequency band, wherein the digital unit includes a channel-frequency setting unit configured to set a channel frequency at which the reception signal can be received, and the PLL-setting changing unit performs the setting change of the parameters of the PLL circuit based on the channel frequency, wherein the PLL circuit includes:

a voltage control oscillator configured to control an oscillation frequency of the clock based on voltage control;

a frequency divider configured to subject the clock generated by the voltage control oscillator to frequency division;

a phase comparator configured to compare a phase of the clock subjected to the frequency division by the frequency divider and a phase of a reference signal;

a charge pump circuit configured to generate a voltage corresponding to a phase error between the clock and the reference signal;

a loop filter configured to reduce a high-frequency component included in the voltage generated by the charge pump circuit to generate the voltage control;

a first selector configured to switch a current setting value of the charge pump circuit based on a setting control signal from the PLL-setting changing unit; and a second selector configured to switch a bandwidth setting value of the loop filter based on the setting control signal from the PLL-setting changing unit.

7. The radio communication apparatus according to claim 6, wherein, when spurious is present in the channel frequency, the PLL-setting changing unit increases the jitter of the clock compared with the jitter of the clock controlled when spurious is absent in the channel frequency.

8. The radio communication apparatus according to claim 6, wherein, when spurious is present in the channel frequency, the PLL-setting changing unit switches the current setting value or the bandwidth setting value to increase the jitter of the clock compared with the jitter of the clock controlled when spurious is absent in the channel frequency.

9. A radio communication apparatus comprising:

an analog unit configured to perform frequency conversion of a reception signal;

a digital unit configured to perform demodulation processing of the reception signal subjected to the frequency conversion by the analog unit;

a PLL circuit configured to generate a clock to the digital unit; and a PLL-setting changing unit configured to perform, based on the reception signal, a setting change of parameters of the PLL circuit to thereby control a jitter of the clock, wherein the analog unit includes:

an RF reception unit configured to receive the reception signal in a radio frequency band;

a demodulation unit configured to down-convert the received reception signal in the radio frequency band to a baseband;

an analog baseband (BB) unit configured to subject the down-converted reception signal or a transmission signal to analog processing in the baseband;

a modulation unit configured to up-convert the transmission signal in the baseband to the radio frequency band; and an RF transmission unit configured to transmit the transmission signal in the radio frequency band, wherein the digital unit includes a communication-state managing unit configured to manage whether a present communication state is a reception state or a transmission state, and the PLL-setting changing unit performs the setting change of the parameters of the PLL circuit based on the present communication state, wherein the PLL circuit includes:

a voltage control oscillator configured to control an oscillation frequency of the clock based on voltage control;

a frequency divider configured to subject the clock generated by the voltage control oscillator to frequency division;

a phase comparator configured to compare a phase of the clock subjected to the frequency division by the frequency divider and a phase of a reference signal;

a charge pump circuit configured to generate a voltage corresponding to a phase error between the clock and the reference signal;

a loop filter configured to reduce a high-frequency component included in the voltage generated by the charge pump circuit to generate the voltage control;

a first selector configured to switch a current setting value of the charge pump circuit based on a setting control signal from the PLL-setting changing unit; and a second selector configured to switch a bandwidth setting value of the loop filter based on the setting control signal from the PLL-setting changing unit.

10. The radio communication apparatus according to claim 9, wherein, when the present communication state is the reception state, the PLL-setting changing unit increases the jitter of the clock compared with the jitter of the clock controlled when the present communication state is the transmission state.

11. The radio communication apparatus according to claim 9, wherein, when the present communication state is the reception state, the PLL-setting changing unit switches the current setting value or the bandwidth setting value to increase the jitter of the clock compared with the jitter of the clock controlled when the present communication state is the transmission state.

12. A radio communication apparatus comprising:
an analog unit configured to perform frequency conversion of a reception signal;
a digital unit configured to perform demodulation processing of the reception signal subjected to the frequency conversion by the analog unit;
a PLL circuit configured to generate a clock to the digital unit; and a PLL-setting changing unit configured to perform, based on the reception signal, a setting change of parameters of the PLL circuit to thereby control a jitter of the clock, wherein, when spurious is present in a channel frequency and a reception power of the reception signal is smaller than a threshold, the PLL-setting changing unit increases the jitter of the clock, and when spurious is present in the channel frequency and the reception power of the reception signal is equal to or larger than the threshold, the PLL-setting changing unit normalizes the jitter of the clock.

13. The radio communication apparatus according to claim 12, wherein the digital unit includes:

a reception-power measuring unit configured to measure reception power based on an amplitude level of the reception signal after A/D conversion;

a channel-frequency setting unit configured to set the channel frequency at which the reception signal can be received; and a communication-state managing unit configured to manage whether a present communication state is a reception state or a transmission state, and when the present communication state is the reception state, spurious is present in the channel frequency, and the reception power is smaller than a threshold, the PLL-setting changing unit increases the jitter of the clock, and when the present communication state is the reception state, spurious is absent in the channel frequency, and the reception power is equal to or larger than the threshold, the PLL-setting changing unit normalizes the jitter of the clock.

14. The radio communication apparatus according to claim 12, wherein the PLL circuit includes:

a voltage control oscillator configured to control an oscillation frequency of the clock based on voltage control;

a frequency divider configured to subject the clock generated by the voltage control oscillator to frequency division;

a phase comparator configured to compare a phase of the clock subjected to the frequency division by the frequency divider and a phase of a reference signal;

a charge pump circuit configured to generate a voltage corresponding to a phase error between the clock and the reference signal; and a loop filter configured to reduce a high-frequency component included in the voltage generated by the charge pump circuit to generate the voltage control, and the PLL-setting changing unit performs the setting change of a current setting value of the charge pump circuit or a bandwidth setting value of the loop filter based on the reception signal to thereby control the jitter of the clock.

* * * * *